United States Patent
Boisvert et al.

(10) Patent No.: US 8,642,883 B2
(45) Date of Patent: Feb. 4, 2014

(54) HETEROJUNCTION SOLAR CELL

(75) Inventors: Joseph Charles Boisvert, Thousand Oaks, CA (US); Daniel C. Law, Arcadia, CA (US); Richard R. King, Thousand Oaks, CA (US); Christopher M. Fetzer, Valencia, CA (US)

(73) Assignee: The Boeing Company, Chicago, IL (US)

( * ) Notice: Subject to any disclaimer, the term of this patent is extended or adjusted under 35 U.S.C. 154(b) by 592 days.

(21) Appl. No.: 12/852,574

(22) Filed: Aug. 9, 2010

(65) Prior Publication Data

US 2012/0031478 A1 Feb. 9, 2012

(51) Int. Cl.
*H01L 31/00* (2006.01)
(52) U.S. Cl.
USPC .......................................... 136/255; 136/252
(58) Field of Classification Search
CPC ................... H01L 31/0304; H01L 31/03046; H01L 31/0693
USPC ................................................ 136/255, 262
See application file for complete search history.

(56) References Cited

U.S. PATENT DOCUMENTS

| 6,300,557 | B1 | 10/2001 | Wanlass |
| 2007/0137695 | A1 | 6/2007 | Fetzer et al. |
| 2009/0078310 | A1 | 3/2009 | Stan et al. |
| 2010/0006143 | A1* | 1/2010 | Welser .......................... 136/255 |
| 2010/0096010 | A1* | 4/2010 | Welser .......................... 136/256 |
| 2010/0147366 | A1 | 6/2010 | Stan |

OTHER PUBLICATIONS

Campesato et al., "High efficiency solar cells based on AlInGaP," Photovoltaic Specialists Conference (PVSC), 2009 34th IEEE, Jun. 7-12, 2009.*
Unknown, "Energy band gap Eg of AlXGa1-xAs alloys," (1994).*
Popescu et al., Physical Review B, 78 205321 (2008).*
King, R.R. et al., "40% efficient metamorphic GaInP / GaInAs / Ge multijunction solar cells," Appl. Phys. Lett., vol. 90, No. 18, 183516, May 4, 2007.
King, R.R. et al., "Band-Gap-Engineered Architectures for High-Efficiency Multijunction Concentrator Solar Cells," 24th European Photovoltaic Solar Energy Conf., Hamburg, Germany, Sep. 21-25, 2009.
Law, D.C. et al., "Semiconductor-Bonded III-V Multijunction Space Solar Cells," 34th IEEE PVSC, 2009.
PCT, International Search Report and Written Opinion, International Application No. PCT/US2011/043124 (Nov. 6, 2012).

* cited by examiner

*Primary Examiner* — Eli Mekhlin
(74) *Attorney, Agent, or Firm* — Diane M. Tsuda

(57) ABSTRACT

A solar cell including a base semiconductor layer having a first bandgap, an emitter semiconductor layer having a second bandgap and a depletion semiconductor layer positioned between the base semiconductor layer and the emitter semiconductor layer, the depletion semiconductor layer having a third bandgap, wherein the third bandgap is greater than the first bandgap and the second bandgap.

17 Claims, 4 Drawing Sheets

HETEROJUNCTION SOLAR CELL

GOVERNMENT CONTRACT

This invention was made with Government support under FA9453-09-C-0373 awarded by the United States Air Force. The Government of the United States may have certain rights in this invention.

FIELD

This application relates to optoelectronic semiconductor structures, such as solar cells, photodetectors and the like, which are broadly referred to herein as solar cells. More particularly, this application relates to heterojunction solar cells.

BACKGROUND

Advances in solar technology have led to the development of high efficiency multi-junction solar cells comprised of multiple subcells. Each subcell of a multi-junction solar cell is designed to generate the same amount of current as the other subcells under the same lighted conditions to optimize power conversion efficiency. However, the need for the same current from each subcell has led to compromises in the design of the subcells.

Traditionally, the current generated by each subcell was controlled by reducing the subcell voltage. Specifically, the alloy composition of the base semiconductor layer of the subcell was engineered to yield the desired amount of current. For example, lower bandgap alloys have been used in the base semiconductor layer to achieve a higher current output at the expense of a lower output voltage for the subcell.

The power conversion efficiency of a subcell is a function of both the output voltage and the output current. Therefore, current matching the subcells of a solar cell by altering the alloy composition of the base semiconductor layer adversely affects the power conversion efficiency.

Accordingly, those skilled in the art continue with research and development efforts in the field of solar cells.

SUMMARY

In one aspect, the disclosed solar cell may include a base semiconductor layer having a first bandgap, an emitter semiconductor layer having a second bandgap and a depletion semiconductor layer positioned between the base semiconductor layer and the emitter semiconductor layer, the depletion semiconductor layer having a third bandgap, wherein the third bandgap is greater than the first bandgap and the second bandgap.

In another aspect, the disclosed solar cell may include a plurality of subcells, wherein at least one subcell of the plurality of subcells includes a base semiconductor layer having a first bandgap, an emitter semiconductor layer having a second bandgap and a depletion semiconductor layer positioned between the base semiconductor layer and the emitter semiconductor layer, the depletion semiconductor layer having a third bandgap, wherein the third bandgap is greater than the first bandgap and the second bandgap.

In yet another aspect, the disclosed solar cell may include a base semiconductor layer having a first bandgap and an emitter semiconductor layer having a second bandgap, wherein the base semiconductor layer and the emitter semiconductor layer define a p-n junction, and wherein the second bandgap is greater than the first bandgap.

Other aspects of the disclosed solar cell will become apparent from the following description, the accompanying drawings and the appended claims.

DETAILED DESCRIPTION

Figure 1:
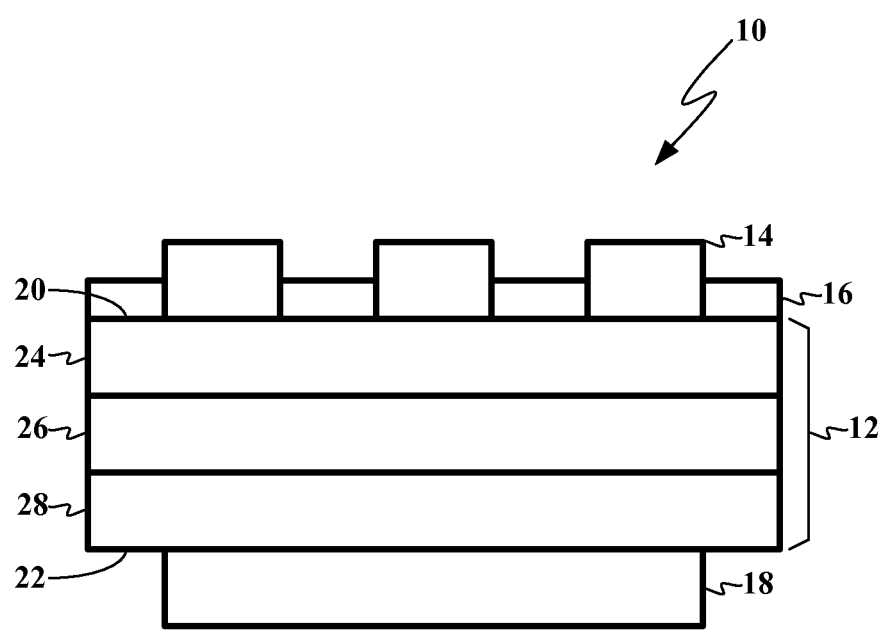
FIG. 1 is a schematic cross-sectional view of one aspect of the disclosed solar cell structure.

Referring to FIG. 1, one aspect of the disclosed solar cell structure, generally designated 10, may include a solar cell 12, a front contact layer 14, an anti-reflective coating layer 16 and a back contact layer 18. Additional layers, such as a support layer, a reflective layer and/or a cover glass layer, while not shown in the drawings, may be included without departing from the scope of the present disclosure.

The front contact layer 14 and the anti-reflective coating layer 16 may be positioned over the front surface 20 of the solar cell 12 and the back contact layer 18 may be positioned over the back surface 22 of the solar cell 12. The solar cell 12 may produce a voltage across the front surface 20 and the back surface 22 when the front surface 20 is exposed to electro-magnetic radiation, such as solar radiation.

The solar cell 12 may include one or more subcells 24, 26, 28. In one implementation, the solar cell 12 may be a multi junction solar cell that includes a top subcell 24, one or more middle subcells 26 and a bottom subcell 28. For example, the multi junction solar cell may be a gallium arsenide ("GaAs") solar cell or an inverted metamorphic ("IMM") solar cell.

Figure 2:
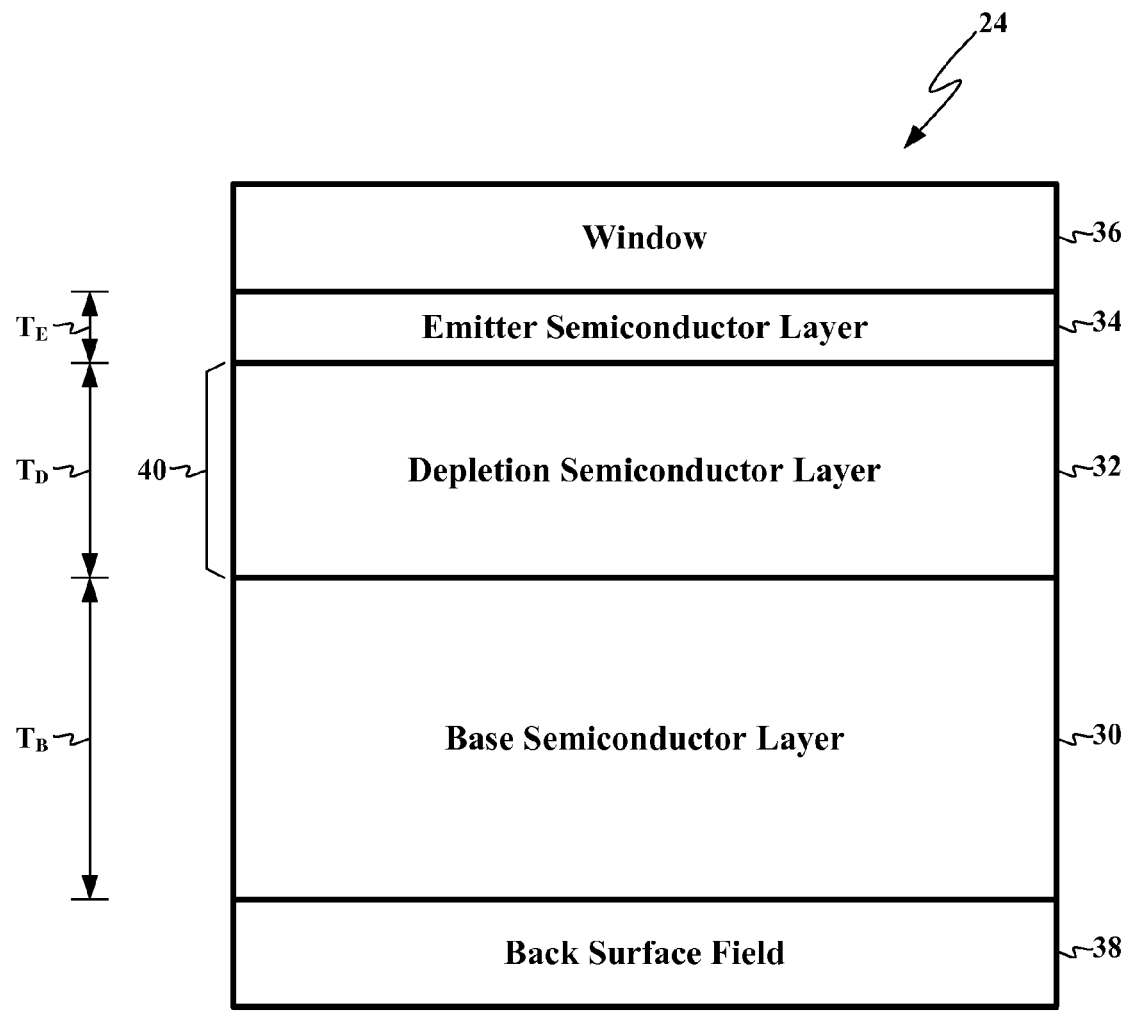
FIG. 2 is a schematic cross-sectional view of a subcell of the solar cell structure of FIG. 1.

Subcell 24 of solar cell 12 is shown in FIG. 2. Those skilled in the art will appreciate that any subcell 24, 26, 28 of solar cell 12 may be structured as shown in FIG. 2. In one expression, all subcells 24, 26, 28 of solar cell 12 may be structured as shown in FIG. 2. In another expression, some, but not all, subcells 24, 26, 28 of solar cell 12 (e.g., only the middle 26 and bottom 28 subcells) may be structured as shown in FIG. 2.

Subcell 24 may include a base semiconductor layer 30, a depletion semiconductor layer 32 and an emitter semiconductor layer 34. Optionally, the subcell 24 may also include a window layer 36 positioned over the emitter semiconductor layer 34 and a back surface field layer 38 positioned over the base semiconductor layer 30. Other components and layers may also be included in subcell 24 without departing from the scope of the present disclosure.

The base semiconductor layer 30 may include a first semiconductor material and may have a first bandgap, a first polarity and a cross-sectional thickness $T_B$.

The first semiconductor material of the base semiconductor layer 30 may be any appropriate semiconductor material. In one specific implementation, the first semiconductor material may be a Group III-V metal or metal alloy. For example, the first semiconductor material may be formed from or may include a Group III-V alloy, such as GaInP, GaAs, GaInAs or InP.

The polarity of the base semiconductor layer 30 (i.e., the first polarity) may be either positive (i.e., p-type) or negative (i.e., n-type). In one example, the base semiconductor layer 30 may be doped as a p-type semiconductor. In another example, the base semiconductor layer 30 may be doped as an n-type semiconductor.

The cross-sectional thickness $T_B$ of the base semiconductor layer 30 may depend on various factors, including the composition of the base semiconductor layer 30. As a general example, the base semiconductor layer 30 may have a cross-sectional thickness $T_B$ ranging from about 0.1 to about 10 microns. As a specific example, the base semiconductor layer 30 may have a cross-sectional thickness $T_B$ of about 1 micron. In one realization, the base semiconductor layer 30 may define a plane and the cross-sectional thickness $T_B$ may be measured perpendicular to that plane.

The emitter semiconductor layer 34 may include a second semiconductor material and may have a second bandgap, a second polarity and a cross-sectional thickness $T_E$.

In a first implementation, the semiconductor material of the emitter semiconductor layer 34 may have substantially the same chemical composition as the semiconductor material of the base semiconductor layer 34 (i.e., the first and second semiconductor materials may be the same except for the presence of different dopants or different quantities of dopants). Therefore, in one expression of the first implementation, the bandgap of the emitter semiconductor layer 34 may be substantially the same as the bandgap of the base semiconductor layer 34 (i.e., the first and second bandgaps may be substantially the same).

In another expression of the first implementation, despite being formed from substantially the same materials, the bandgap of the emitter semiconductor layer 34 may be different than the bandgap of the base semiconductor layer 34 (i.e., the first and second bandgaps may be different). As one example, the bandgap of the emitter semiconductor layer 34 may be greater than the bandgap of the base semiconductor layer 34. As another example, the bandgap of the emitter semiconductor layer 34 may be smaller than the bandgap of the base semiconductor layer 34.

In a second implementation, the semiconductor material of the emitter semiconductor layer 34 may have a different chemical composition than the semiconductor material of the base semiconductor layer 34 (i.e., the first and second semiconductor materials may be different). Therefore, in one expression of the second implementation, the bandgap of the emitter semiconductor layer 34 may be different than the bandgap of the base semiconductor layer 34 (i.e., the first and second bandgaps may be different). As one example, the compositions of the emitter semiconductor layer 34 and the base semiconductor layer 30 may be engineered to provide the base semiconductor layer 30 with a greater bandgap than the emitter semiconductor layer 34. As another example, the compositions of the emitter semiconductor layer 34 and the base semiconductor layer 30 may be engineered to provide the emitter semiconductor layer 34 with a greater bandgap than the base semiconductor layer 34.

Whether or not the base semiconductor layer 30 and the emitter semiconductor layer 30 have the same or different chemical compositions, the layers 30, 34 may be doped to achieve opposite polarities. For example, when the base semiconductor layer 30 is p-type, the emitter semiconductor layer 34 may be n-type.

The cross-sectional thickness $T_E$ of the emitter semiconductor layer 34 may depend on various factors, including the composition of the emitter semiconductor layer 34. As a general example, the emitter semiconductor layer 34 may have a cross-sectional thickness $T_E$ ranging from about 0.01 to about 0.1 microns. As a specific example, the emitter semiconductor layer 34 may have a cross-sectional thickness $T_E$ of about 0.05 micron. In one realization, the emitter semiconductor layer 34 may define a plane and the cross-sectional thickness $T_E$ may be measured perpendicular to that plane.

The base semiconductor layer 30 and the emitter semiconductor layer 34 may define a p-n junction having a depletion region 40 between the base semiconductor layer 30 and the emitter semiconductor layer 34. The depletion semiconductor layer 32 may be positioned in, and may overlap and/or eclipse, the depletion region 40.

The depletion semiconductor layer 32 may include a third semiconductor material and may have a third bandgap, a third polarity and a cross-sectional thickness $T_D$.

The bandgap of the depletion semiconductor layer 32 may be greater than the bandgap of the base semiconductor layer 30 and the bandgap of the emitter semiconductor layer 34. Without being limited to any particular theory, it is believed that the higher bandgap depletion semiconductor layer 32 suppresses recombination in the depletion region 40, thereby resulting in a higher voltage output.

In one embodiment, the bandgap of the depletion semiconductor layer 32 may be at least 1 percent greater than the bandgap of the base semiconductor layer 30 and the bandgap of the emitter semiconductor layer 34. In another embodiment, the bandgap of the depletion semiconductor layer 32 may be at least 1.5 percent greater than the bandgap of the base semiconductor layer 30 and the bandgap of the emitter semiconductor layer 34.

A high bandgap may be achieved in the depletion semiconductor layer 32 by altering the composition of the depletion semiconductor layer 32 relative to the base 30 and emitter 34 semiconductor layers. Examples of several material systems suitable for forming a subcell 24 wherein the depletion layer 32 has a higher bandgap than the base 30 and emitter 34 layers are provided in Table 1.

TABLE 1

| System | Base Layer | Depletion Layer | Emitter Layer |
|---|---|---|---|
| 1 | GaInP | AlGaInP | GaInP |
| 2 | GaInP (ordered) | GaInP (disordered) | GaInP (ordered) |
| 3 | GaAs | AlGaAs | GaAs |
| 4 | GaInAs | AlGaAs | GaInAs |
| 5 | GaInAs | AlGaInAs | GaInAs |
| 6 | GaAs | GaInPAs | GaAs |
| 7 | GaInAs | GaInPAs | GaInAs |
| 8 | InP | GaInPAs | InP |
| 9 | InP | AlGaInAs | InP |

The polarity of the depletion semiconductor layer 32 may correspond to the polarity of either the base semiconductor layer 30 or the emitter semiconductor layer 34. In a first expression, the polarity of the depletion semiconductor layer 32 may be the same as the polarity of the base semiconductor layer 30. As such, the depletion semiconductor layer 32 may effectively be part of the base semiconductor layer 30. In a second expression, the polarity of the depletion semiconductor layer 32 may be the same as the polarity of the emitter semiconductor layer 34. As such, the depletion semiconductor layer 32 may effectively be part of the emitter semiconductor layer 34.

The cross-sectional thickness $T_D$ of the depletion semiconductor layer 32 may be engineered to be substantially the same as the cross-sectional thickness (i.e., the width) of the depletion region 40. Those skilled in the art will appreciate that the width of the depletion region 40 may depend on the properties of the base 30 and emitter 34 semiconductor layers that define the depletion region 40.

As a general example, the depletion semiconductor layer 32 may have a cross-sectional thickness $T_D$ ranging from about 0.1 to about 1 microns. As a specific example, the depletion semiconductor layer 32 may have a cross-sectional thickness $T_D$ of about 0.5 microns. In one realization, the depletion semiconductor layer 32 may define a plane and the cross-sectional thickness $T_D$ may be measured perpendicular to that plane.

As one specific, non-limiting example, subcell 24 may be formed from GaInP and GaAlInP using a metal organic vapor phase epitaxy process to grow the layers 30, 32, 34. Specifically, the base semiconductor layer 30 may be disordered GaInP having a bandgap of 1.89 eV and a cross-sectional thickness $T_B$ of about 1.0 microns. The base semiconductor layer 30 may be doped as a p-type semiconductor with about $5 \times 10^{17}$ atoms/cm$^2$. The depletion semiconductor layer 32 may be GaAlInP having a bandgap of 1.92 to 1.95 eV and a cross-sectional thickness $T_D$ of about 0.5 microns. The depletion semiconductor layer 32 may be doped as a p-type semiconductor with about $1 \times 10^{16}$ atoms/cm$^2$. The emitter semiconductor layer 34 may be disordered GaInP having a bandgap of 1.89 eV and a cross-sectional thickness $T_E$ of about 0.05 microns. The emitter semiconductor layer 34 may be doped as an n-type semiconductor with about $5 \times 10^{18}$ atoms/cm$^2$.

Those skilled in the art will appreciate that in some semiconductor material systems, higher bandgap compositions tend to have degraded material properties, such as minority carrier lifetime, mobility and diffusion length. For example, in the AlGaInP/GaInP system, AlGaInP can be used to achieve higher band gaps than GaInP at the same lattice constant, but the strong Al—O bond tends to increase oxygen contamination in AlGaInP. For this reason, and perhaps others, minority hole and minority electron lifetime and mobility are typically lower in AlGaInP than in GaInP. The low hole diffusion length in n-type AlGaInP results in low collection probability for carriers photogenerated in the emitter semiconductor layer 34 by short wavelengths of light (low blue response). By using Al-free GaInP for the emitter semiconductor layer 34, much longer hole diffusion lengths can be achieved, resulting in significantly greater blue response than with a Al-containing AlGaInP emitter layer, in spite of the small barrier to carrier flow that could be introduced by the high band gap AlGaInP layer in the depletion region 40. The electric field is high in the depletion region 40, which greatly facilitates carrier collection, even if the AlGaInP used there has relatively low carrier lifetime and mobility.

Similarly, if part or all of the base semiconductor layer 30 is formed using the better material properties of GaInP, while leaving the higher bandgap AlGaInP in the depletion region 40 to increase voltage, carrier collection from that Al-free GaInP portion of the p-type base semiconductor layer 30 will benefit from the high minority electron lifetime and mobility of p-type GaInP in the base semiconductor layer 30.

Figure 3:
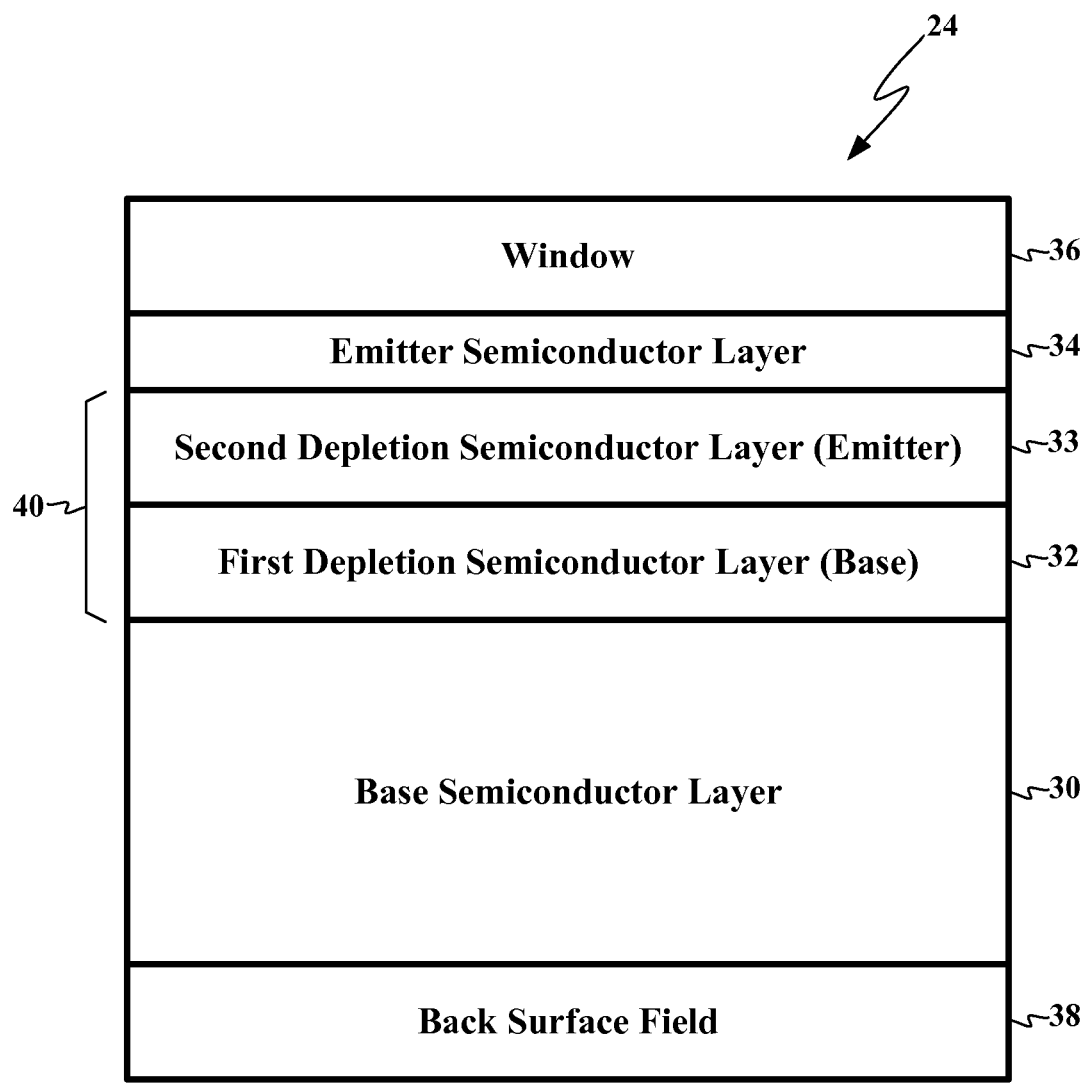
FIG. 3 is a schematic cross-sectional view of a subcell in accordance with another aspect of the disclosure.

Referring to FIG. 3, in another aspect, subcell 12 may include two or more depletion semiconductor layers 32, 33 positioned in the depletion region 40 between the base 30 and emitter 34 semiconductor layers. Each depletion semiconductor layer 32, 33 may have a higher bandgap than the base 30 and emitter 34 semiconductor layers. The first depletion semiconductor layer 32 may have the same polarity as the base semiconductor layer 30 and may effectively be part of the base semiconductor layer 30, and the second depletion semiconductor layer 33 may have the same polarity as the emitter semiconductor layer 34 and may effectively be part of the base semiconductor layer 30.

Thus, although the depletion region 40 is typically mostly in the base semiconductor layer 30, it also necessarily extends somewhat into the emitter semiconductor layer 34. Therefore, introducing a higher bandgap depletion semiconductor layers 32, 33 to both the base 30 and emitter 34 layers may further suppress recombination and raise cell voltage.

Accordingly, the disclosed subcell 24 may includes one or more depletion semiconductor layers 32, 33 formed from a higher bandgap material. The depletion semiconductor layer 32 may overlap the depletion region 40 between the base semiconductor layer 30 and the emitter semiconductor 34. The higher bandgap depletion semiconductor layers 32, 33 may lower dark current output and may increase output voltage. Therefore, by limiting the higher bandgap semiconductor material to just a small fraction of the subcell 24, the remainder of the subcell 24 (e.g., the base semiconductor layer 30 and emitter semiconductor layer 34) may be optimized for current generation independently, thereby de-coupling current generation from voltage performance.

Figure 4:
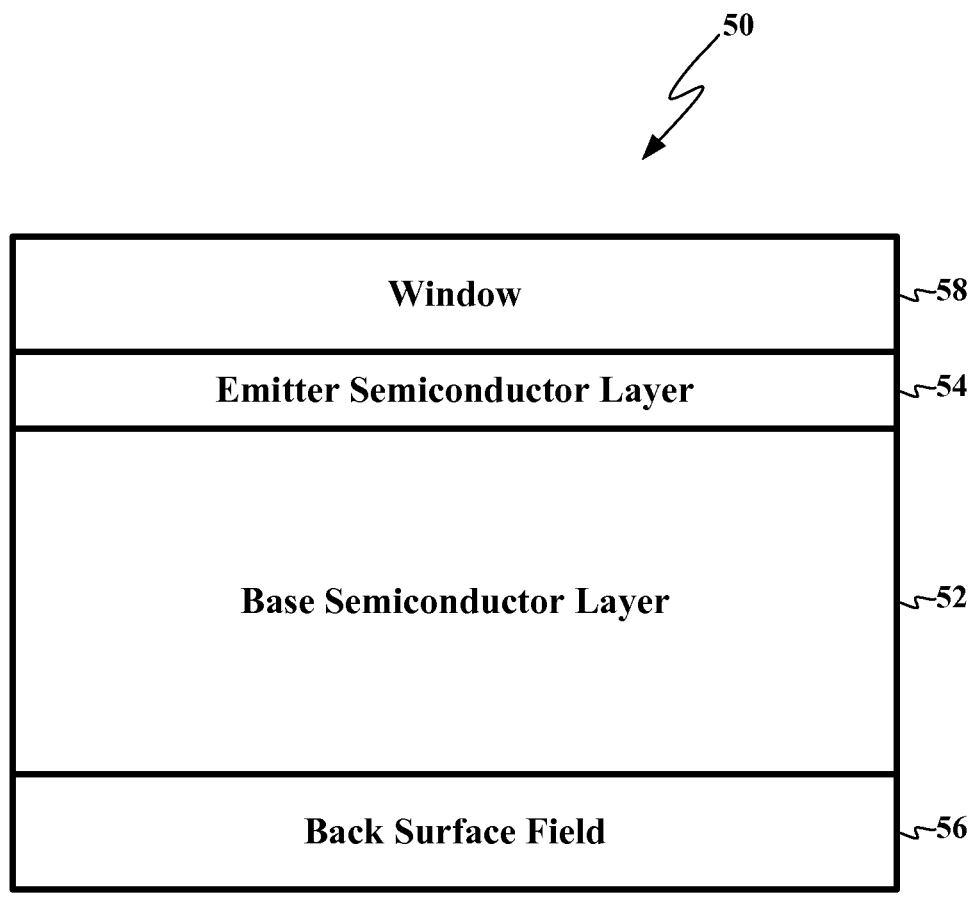
FIG. 4 is a schematic cross-sectional view of a subcell in accordance with yet another aspect of the disclosure.

Referring to FIG. 4, in yet another aspect, a subcell 50 may include a base semiconductor layer 52, an emitter semiconductor layer 54 and, optionally, a back surface field layer 56 and a window layer. The base semiconductor layer 52 may have a higher bandgap than the emitter semiconductor layer 54.

Although various aspects of the disclosed heterojunction solar cell have been shown and described, modifications may occur to those skilled in the art upon reading the specification. The present application includes such modifications and is limited only by the scope of the claims.

What is claimed is:

1. A solar cell made of a material selected from a Group III-V semiconductor, the solar cell comprising:
    a base semiconductor layer having a first bandgap;
    an emitter semiconductor layer having a second bandgap; and
    at least one depletion semiconductor layer positioned between said base semiconductor layer and said emitter semiconductor layer and collectively extending from said base semiconductor layer to said emitter semiconductor layer, each of said at least one depletion semiconductor layer having a third bandgap greater than said first bandgap and said second bandgap.

2. The solar cell of claim 1 wherein said first bandgap is the same as said second bandgap.

3. The solar cell of claim 1 wherein said first bandgap is greater than said second bandgap.

4. The solar cell of claim 1 wherein at least one third bandgap is at least 1 percent greater than said first bandgap and said second bandgap.

5. The solar cell of claim 1 wherein at least one third bandgap is at least 1.5 percent greater than said first bandgap and said second bandgap.

6. The solar cell of claim 1 wherein said base semiconductor layer comprises a p-type semiconductor material and said emitter semiconductor layer comprises an n-type semiconductor material.

7. The solar cell of claim 6 wherein said depletion semiconductor layer comprises a p-type semiconductor material.

8. The solar cell of claim 7 further comprising a second depletion semiconductor layer positioned between said depletion semiconductor layer and said emitter semiconductor layer.

9. The solar cell of claim 8 wherein said second depletion semiconductor layer comprises an n-type semiconductor material.

10. The solar cell of claim 1 wherein said base semiconductor layer and said emitter semiconductor layer define a depletion region having a first cross-sectional thickness, and wherein said at least one depletion semiconductor layer has a second cross-sectional thickness, said second cross-sectional thickness being equal to said first cross-sectional thickness.

11. The solar cell of claim 1 wherein said at least one depletion semiconductor layer fully eclipses said depletion region.

12. The solar cell of claim 1 wherein said at least one depletion semiconductor layer has a cross-sectional thickness ranging from 0.1 to 1 microns.

13. The solar cell of claim 1 wherein said base semiconductor layer comprises a first semiconductor composition and said emitter semiconductor layer comprises a second semiconductor composition, and wherein said first semiconductor composition is the same as said second semiconductor composition.

14. The solar cell of claim 1 wherein said base semiconductor layer comprises a first semiconductor composition, said emitter semiconductor layer comprises a second semiconductor composition and said at least one depletion semiconductor layer comprises a third semiconductor composition, and wherein said third semiconductor composition is different than said first and said second semiconductor compositions.

15. The solar cell of claim 1 wherein each of said base, said depletion and said emitter semiconductor layers comprises one of GaInP, AlGaInP, GaInP (ordered), GaInP (disordered), AlGaAs, GaAs, GaInAs, AlGaAs, InP, GaInPAs, and AlGaInAs.

16. The solar cell of claim 1 wherein said at least one depletion semiconductor layer comprises aluminum and wherein at least one of said base semiconductor layer and said emitter semiconductor layer is free of aluminum.

17. A solar cell made of a material selected from a Group III-V semiconductor, the solar cell comprising:
   a plurality of subcells, wherein at least one subcell of said plurality of subcells comprises:
      a base semiconductor layer having a first bandgap;
      an emitter semiconductor layer having a second bandgap; and
      at least one depletion semiconductor layer positioned between said base semiconductor layer and said emitter semiconductor layer and collectively extending from said base semiconductor layer to said emitter semiconductor layer, each of said at least one depletion semiconductor layer having a third bandgap greater than said first bandgap and said second bandgap.

* * * * *